(12) United States Patent
Zueger

(10) Patent No.: US 6,572,738 B1
(45) Date of Patent: Jun. 3, 2003

(54) VACUUM TREATMENT SYSTEM AND PROCESS FOR MANUFACTURING WORKPIECES

(75) Inventor: Othmar Zueger, Triesen (LI)

(73) Assignee: Unaxis Balzers Aktiengesellschaft, Fuerstentum (LI)

( * ) Notice: Subject to any disclaimer, the term of this patent is extended or adjusted under 35 U.S.C. 154(b) by 0 days.

(21) Appl. No.: 09/536,711

(22) Filed: Mar. 28, 2000

(30) Foreign Application Priority Data

May 25, 1999 (CH) .............................. 0964/99

(51) Int. Cl.$^7$ .................. C23C 14/34; B05D 5/06; B05C 11/00; B05C 13/00
(52) U.S. Cl. .................. 204/192.13; 204/298.03; 204/298.23; 204/298.28; 427/8; 427/162; 118/712; 118/500
(58) Field of Search .............. 204/192.12, 192.13, 204/192.26, 298.03, 298.23, 298.28; 427/8, 162; 118/712, 500; 156/345

(56) References Cited

U.S. PATENT DOCUMENTS

| 4,283,260 A | * | 8/1981 | Thomas et al. | .......... 204/192 R |
| 5,154,810 A | * | 10/1992 | Kamerling et al. | .... 204/192.13 |
| 5,225,057 A | | 7/1993 | LeFebvre et al. | ........... 204/192 |
| 5,423,970 A | | 6/1995 | Kugler | ........................ 204/298 |

FOREIGN PATENT DOCUMENTS

| GB | 813 251 | 5/1959 | ........... C23C/14/24 |
| JP | 03 264667 | 11/1991 | ........... C23C/14/54 |
| JP | 06 041732 | 2/1994 | ........... C03C/14/54 |
| JP | 11 050239 | 2/1999 | ........... C23C/14/24 |

* cited by examiner

Primary Examiner—Steven H. VerSteeg

(57) ABSTRACT

A vacuum treatment system has a vacuum treatment chamber, with a sensor arrangement to detect the treatment atmosphere momentarily existing in the treatment area. An ACTUAL value sensor of the sensor arrangement for one or more of the elements to establish a treatment atmosphere is a regulating element of a control circuit for the treatment atmosphere in the treatment area. A workpiece carrier is drivably movable in the chamber through the treatment area having the treatment atmosphere. At least one of the elements modulates the treatment atmosphere in the treatment area according to a defined profile as a function of the workpiece carrier position. A process is disclosed for manufacturing workpieces, in which the workpieces are guided to a vacuum treatment area guided by a control. The treatment atmosphere is modulated in the treatment area as a function of workpiece position with the defined profile. The system and process can be used to deposit defined layer thickness distribution profiles on substrates in a reactive coating.

46 Claims, 8 Drawing Sheets

VACUUM TREATMENT SYSTEM AND PROCESS FOR MANUFACTURING WORKPIECES

BACKGROUND OF THE INVENTION

This application claims the priority of Swiss application 964/99, filed in Switzerland on May. 25, 1999, the disclosure of which is expressly incorporated by reference herein.

The present invention relates to a vacuum treatment system having a vacuum treatment chamber, having elements for establishing a, treatment atmosphere in the chamber, and a sensor arrangement for detecting the treatment atmosphere momentarily existing in a treatment area in the chamber. The sensor arrangement ACTUAL value sensor of at least one of the elements is a regulating element of a control circuit for the treatment atmosphere, and having a workpiece carrier is moved in a driven manner through the, treatment area. The present invention also relates to processes for manufacturing workpieces in which the workpieces are moved in a treatment atmosphere guided by a control.

With respect to the vacuum treatment of workpieces, it is known to control the treatment atmosphere by one or several control systems concerning the maintaining of defined characteristics. This is particularly necessary if the processes taking place for the implementation of a desired treatment atmosphere in a vacuum treatment chamber are unstable per se in desired working points and can be stabilized only by way of a control. An example which is typical in this respect are reactive sputtering processes for coating substrates with non-conductive, thus typically oxidic layers, in the case of which a metallic DC-operated target, typically a magnetron arrangement is used in a reactive gas atmosphere. In addition to an inert working gas, such as argon, the reactive gas, such as oxygen or nitrogen, is fed to the treatment atmosphere. On the one hand, this leads to an intentional coating of the workpieces, for example, an oxide coating, but also to an interference coating of the metallic target. Without a working-point control, such a reactive sputtering process cannot be operated in a stable manner in the so-called transition mode or intramode. With respect to a detailed description of reactive sputtering processes in the above-mentioned transition mode, reference is made to U.S. Pat. No. 5,423,970, the disclosure of which is incorporated herein.

In such control systems, the control quantity (ACTUAL value measurement) is detected by measuring the plasma light emission, for example, in the case of a specific spectral line, by measuring the target voltage. A DESIRED value is defined for the measured control quantity and, corresponding to the control deviations, for example, the flow of reactive gas, in the above-indicated example, the oxygen flow (or, if it is not detected as a control quantity, the target voltage) is set as a regulating quantity in the control circuit. As a result, the operation, particularly a stabilization of the process in the desired working point, for example, in the above-mentioned transition mode, is achieved.

FIGS. 1 to 4 are schematic views of typical vacuum treatment systems of the latter type. They are systems of this type and workpiece manufacturing processes which can be implemented by vacuum treatment systems of this type and at which the problems to be described were recognized and solved according to the invention. The solutions according to the invention can, however, basically be used for systems and processes of the initially mentioned type in which the treatment process or the treatment atmosphere is controlled.

As illustrated by the arrow ω, substrates 1 are moved in a workpiece carrier drum 3 rotating in a treatment chamber past at least one sputtering source 5. The sputtering source 5 with the metallic, thus electrically highly conductive target is, normally constructed as a magnetron source, DC-operated; often additionally with a chopper unit connected between a DC feeder generator and the sputtering source 5, as described in detail in EP-A-0 564 789, also incorporated by reference herein. A chopper unit intermittently switches a current path situated above the sputtering source connections to be of high resistance and low resistance.

In FIGS. 1 to 4, the DC generator and the optionally provided chopper unit are each illustrated in the blocks 7 of the sputtering source feed. In addition to a working gas $G_A$, such as argon, a reactive gas $G_R$, such as oxygen $O_2$, is admitted to the treatment atmosphere U of the vacuum chamber, the reactive gas $G_R$ particularly by way of gas flow regulating valves 10.

Above the sputtering sources 5, a reactive plasma 9 is formed in which the substrates and workpieces 1 moved through by the drum 3 above the sputtering surfaces are sputter-coated. Because not only the substrates 1 are coated with the electrically poorly conductive reaction products formed in the reactive plasma 9 but also the metallic sputtering surfaces of the sputtering sources 5, the coating process described so far, particularly for achieving coating rates which are as high as possible, is unstable. For this reason, particularly in the case of these treatment processes and systems, the treatment process and, in this case, actually the treatment atmosphere acting upon the workpieces 1, is stabilized in the treatment area BB with a control.

As a possible implementation embodiment of such a control circuit according to FIG. 1, a plasma emissions monitor 12 measures the intensities of at least one of the spectral line or lines characteristics of the light emission from the reactive plasma 9. These intensities are fed as a measured control quantity $X_a$ to a controller $14_a$.

In FIG. 2, the target voltage on the sputtering source 5 is measured as the measured ACTUAL quantity $X_b$ of the control circuit by a voltage measuring device 16 and is fed to a controller 14b. With respect to the detection of the measured control quantity X, FIGS. 1, 3 and 2, 4 correspond to one another. At the controllers 14a and 14b, for forming control differences, the respective measured control quantities $X_a$ and $X_b$ are compared with the preferably adjustable guide values $W_a$ and $W_b$, which correspond to the measured control quantities.

In accordance with the formed control differences at the controllers 14a and 14b and their amplification on transmission paths (not illustrated separately) dimensioned with respect to the frequency response according to the rules of control engineering, regulating signals are generated at the output side of the respective controllers 14a, 14b. As seen in FIGS. 1 and 2, the regulating signals, correspondingly marked $S_{aa}$ and $S_{ba}$, are guided to the flow control valves 10 for the reactive gas as regulating elements which are set such that the respectively measured control quantities $X_a$ and $X_b$ are led to the values defined by the guide quantities $W_a$ and $W_b$ and are held there.

As seen in FIGS. 3 and 4, the regulating signal generated on the output side of the controllers 14a and 14b, which is correspondingly marked $S_{ab}$ and $S_{bb}$, is fed to the sputtering source feeds 7 which now themselves act as control regulating elements. This takes place either at their DC generators and/or at their optionally provided chopper units, where the chopper duty cycle is set.

The systems illustrated, for example, by FIGS. 1 to 4 are therefore vacuum treatment systems with a vacuum chamber, having elements for establishing a treatment atmosphere (specifically particularly a sputtering source and reactive gas feeds), and a sensor arrangement for detecting the treatment atmosphere momentarily existing in the chamber, the plasma emissions monitors and voltage measuring devices described as examples. The sensor arrangements ACTUAL-value sensors of at least one of the mentioned elements form a regulating element of one control circuit respectively for the treatment atmosphere.

For depositing electrically poorly conducting or non-conductive layers by way of the release of one layer material component of electrically conductive targets, an approach described in U.S. Pat. No. 5,225,057 involves first carrying out the metallic coating in spatially separated treatment stages and then oxidizing it in a reactive gas stage (an oxidation stage). In this known approach, there is no stability problem with respect to the coating process, but the system configuration consisting of several stages used for this purpose is relatively complicated.

As mentioned above, the present invention is based on treatment systems and manufacturing processes of the type explained by reference to FIGS. 1 to 4. It was demonstrated there that, particularly in the case of wide substrates of a width B larger than the dimension A in the same direction, preferably five times larger, and/or in the case of a small diameter of the substrate drum 3, along the substrate width B, because of the non-linear movement of the substrates in the area BB and relative to the sputtering source 5, a pronounced, approximately parabolic layer thickness distribution is obtained, as illustrated in FIG. 11a. This layer thickness distribution is known as a so-called "chord effect".

The effective width of a substrate is its linearly measured dimension in the direction of its relative movement to the sputtering source 5. The corresponding effective sputtering source dimension A is its linearly measured dimension in the same direction. Furthermore, the above-mentioned substrate width B can definitely be taken up by several side-by-side smaller substrates. The addressed substrate 21 will then actually be a batch substrate.

In addition, it is stressed at this point that, for example, with a view to FIG. 1, the substrates may definitely be arranged on the interior side of a revolving carousel, which revolves around a sputtering source arrangement on a path which will then be concave with respect to the sputtering source arrangement. All foregoing statements and all following statements which are based on the drum arrangements according to FIGS. 1 to 4 analogously apply to the full extent to concave workpiece movements with respect to the sputtering source.

SUMMARY OF THE INVENTION

An object of the present invention is to implement, independently of the movement path and movement alignment of the workpieces moved in the treatment atmosphere, a desired layer thickness distribution in a targeted manner.

In a relevant vacuum treatment system, this object has been achieved in that at least one of the elements for establishing the treatment atmosphere, as a function of the workpiece carrier position, modulates the treatment atmosphere in the treatment area according to a given profile. Also, such a system or the related process, the control, for example, for stabilizing the treatment process, holds the treatment atmosphere in a DESIRED condition or working point. In contrast to U.S. Pat. No. 5,225,057, according to which, by the variation of the sputtering performance when depositing metallic layers, action is taken against the chord effect, in the present invention, a control resists a change of the treatment atmosphere.

In a first currently preferred embodiment of the vacuum treatment system according to the present invention, an adjustable DESIRED value defining unit is provided on the control circuit, as explained by reference to FIGS. 1 to 4, and the modulation provided according to the invention is implemented synchronously with the substrate movement by modulation of the DESIRED value.

In a further currently preferred embodiment of the systems according to the invention, the provided control is carried out more slowly than the treatment atmosphere modulation carried out according to the invention. Accordingly, the control of the "disturbance variable" modulation cannot take place in a settling manner. The modulation introduced according to the invention, with respect to control engineering, is therefore the intentional introduction of a disturbance variable which is not to be settled.

If, as in the preferred system which is explained in FIGS. 1 to 4, the vacuum chamber comprises a sputtering source with an electrically conductive target and if a reactive-gas tank arrangement is connected to the chamber which reactive-gas tank arrangement has a reactive gas which reacts with the material released by the sputtering source to form a material with an electrically poorer conductivity as the coating material, the modulation preferably takes place at the electric source for the feeding of the sputtering source (its current or power), either, in the case of the preferred DC feeding, on the DC generator itself and/or at a chopper which is connected between the DC generator and the sputtering source and whose duty cycle is established.

In a further preferred embodiment, the system according to the invention, as a moved workpiece carrier, has a rotatingly driven carrier drum with workpiece receiving devices distributed on its periphery. The modulation is then synchronized with the drum revolving movement and is applied with a repetition frequency which corresponds to the workpiece carrier passing frequency.

Furthermore, a modulation form memory unit is preferably provided on the system according to the invention. This memory unit has at least one, preferably several previously stored modulation courses as well as a selection unit for the selective adding of the respectively desired modulation curves to the mentioned regulating element.

The process according to the invention of the initially mentioned type for manufacturing workpieces is characterized in that the treatment atmosphere in a treatment area of the workpiece moving path is modulated as a function of the workpiece position by a given profile.

The system according to the invention as well as the process according to the invention are particularly suitable for establishing a homogeneous layer thickness distribution on plane substrates of diameters B larger than the effective dimension A of the sputtering source or for producing defined layer thickness distributions on substrates, thus particularly also on substrates which are not plane. In addition, the present invention basically relates to processes for producing substrates, in which the chord effect is compensated on the substrates which are moved past the sputtering source on a circular path which is convex or concave with respect to a sputtering source.

The above-mentioned U.S. Pat. No. 5,225,057 also teaches modulating the sputtering performance of metallic targets for the compensation of the above-mentioned chord effect, specifically such that, in the case of substrates which are situated centrically with respect to the sputtering source, the sputtering performance passes through a maximum. More precise tests have indicated, however, that this type of modulation is not capable of compensating the addressed chord effect. Surprisingly, as will be demonstrated, the sputtering performance of the source must be modulated as a function of the substrate position such that, in the case of substrates situated centrally with respect to the sputtering source, the sputtering performance passes through a minimum.

Furthermore, manufacturing processes according to the invention are disclosed which particularly effects of the above-mentioned chord phenomenon, relative to a substrate movement which is convex or concave with respect to the sputtering source, are eliminated by a modulation of the reactive gas flow—in the preferably used reactive coating processes—and/or the working gas flow, i.e., the flow of an inert gas.

With respect to the modulation of the sputtering performance and a concave moving path of the substrates with respect to the sputtering source, when the workpieces are situated centrically with respect to the sputtering source, the sputtering performance is preferably modulated to a maximum.

Correspondingly, when the moving path of the substrates is convex with respect to the sputtering source, the reactive gas flow is modulated such that, with workpieces situated centrically with respect to the sputtering source, this flow passes through a maximum and if, in contrast, the substrate moving path is concave, it passes through a minimum.

If the working gas flow alone or in combination with the other defined modulation quantities is modulated according to the invention, this preferably takes place in such a manner that, in the case of a convex moving path of the substrates with respect to the sputtering source, while the workpieces are situated centrically with respect to the sputtering source, the working gas flow passes through a minimum, but, when the moving path is concave, it passes through a maximum.

Other objects, advantages and novel features of the present invention will become apparent from the following detailed description of the invention when considered in conjunction with the accompanying drawings.

DETAILED DESCRIPTION OF THE DRAWINGS

Figure 1:
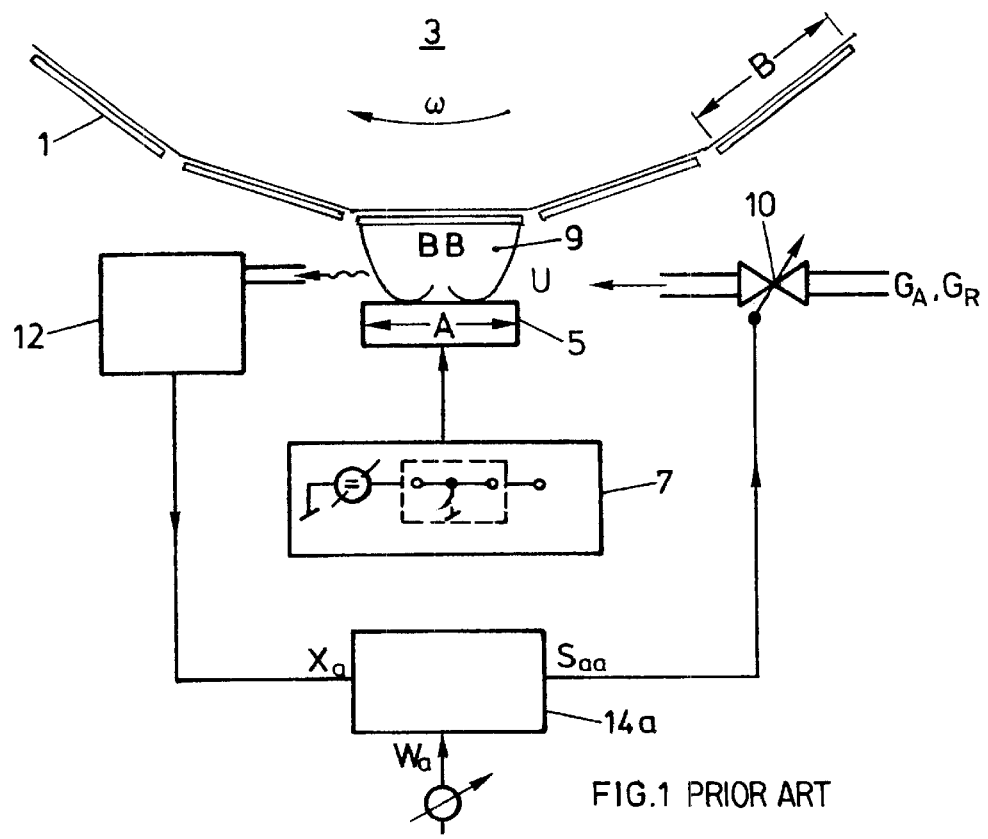
FIGS. 1 to 4 are schematic view of a conventional vacuum treatment system.
Figure 2:
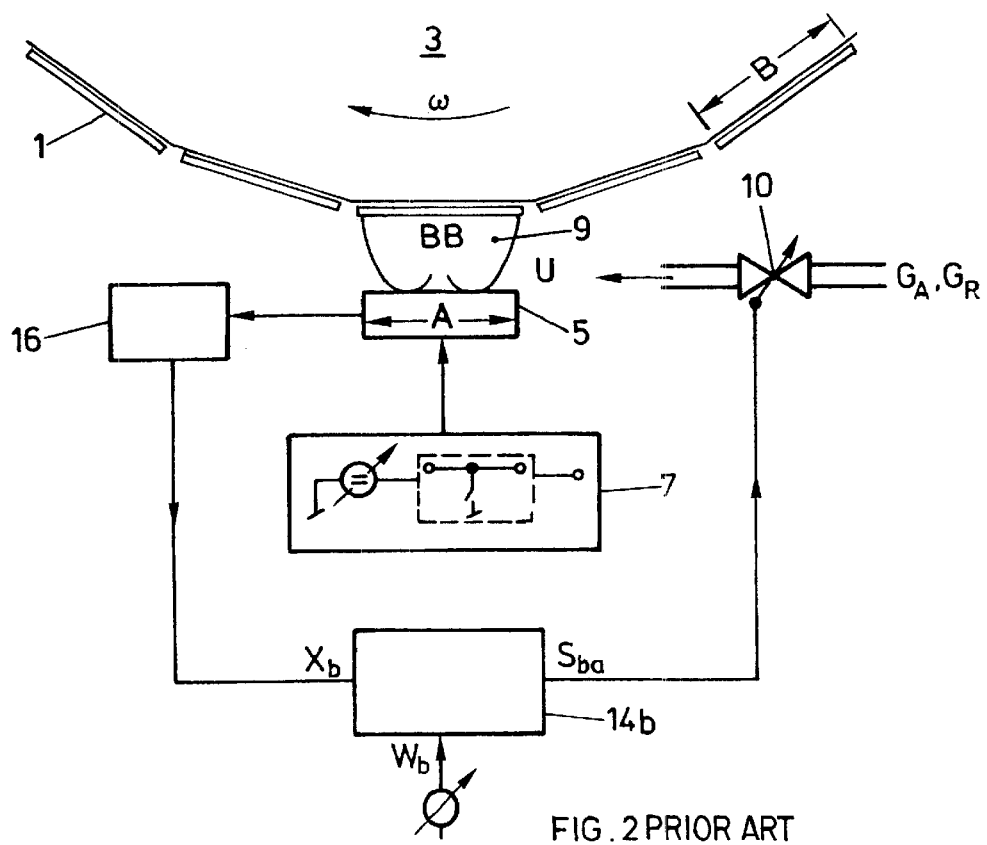
Figure 3:
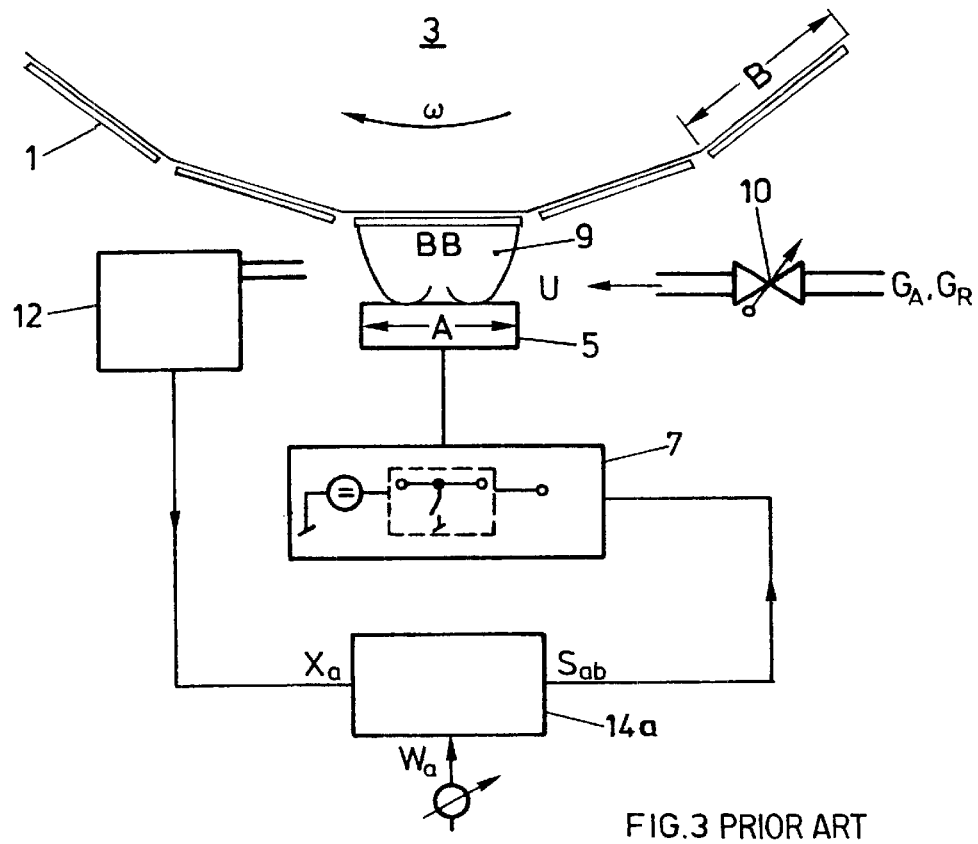
Figure 4:
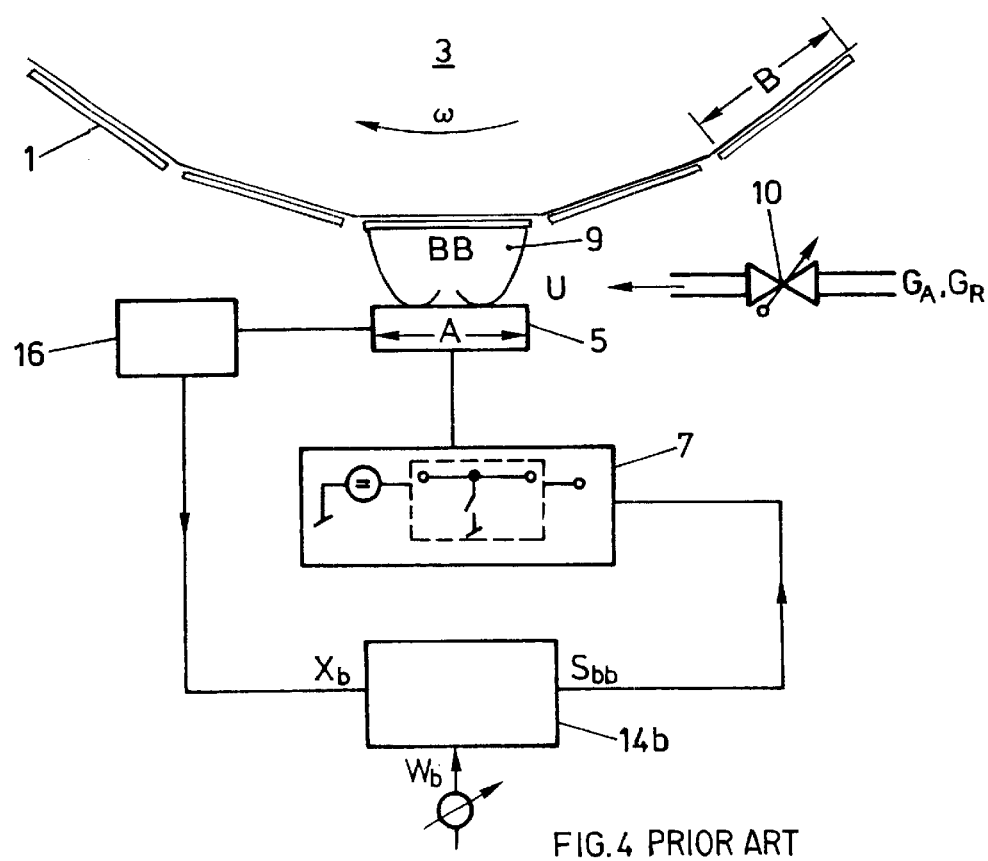
Figure 5:
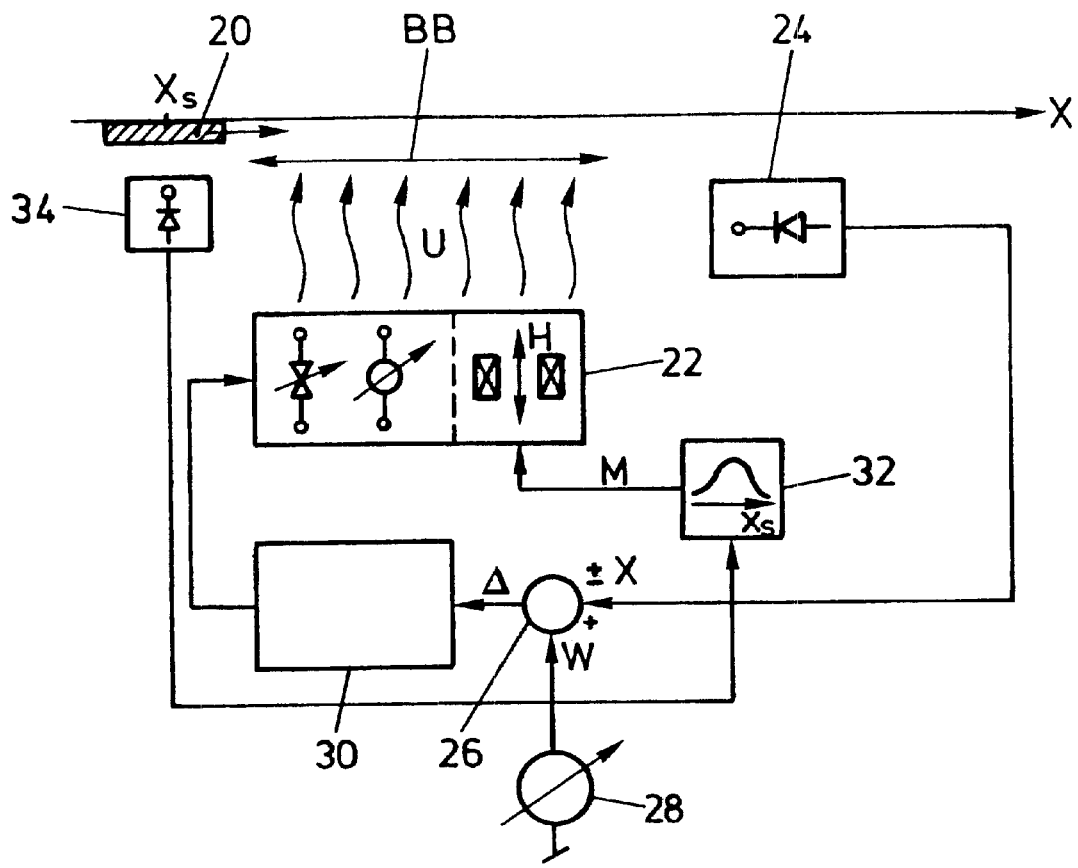
FIG. 5 is a schematic view of a treatment system and process according to the invention.

In FIG. 5, an "x" illustrates the moving path for a workpiece 20 which is to be treated inside a vacuum treatment chamber (not shown). The momentary position of the workpiece 20 along the moving path x is marked $x_s$. Inside the treatment chamber, the workpiece 20 is treated in a treatment area BB in a treatment atmosphere U.

For producing the treatment atmosphere U, elements are provided in the treatment chamber or operatively connected with it which are generally illustrated in FIG. 5 by block 22. Such elements may be formed, for example, by controllable valve arrangements for gas inlets into the treatment chamber, particularly reactive gas inlets and/or working gas inlets, electric supply voltages for plasma discharge paths, heating or cooling elements, magnet arrangements for generating magnetic fields H in the chamber. A sensor arrangement 24 is provided to measure one or several characteristic quantity(ies) of the treatment atmosphere U in the treatment area BB. On the output side, the sensor arrangement 24 is operatively connected with a subtraction unit 26 to which it feeds a measured control quantity signal ±X. In addition, the DESIRED value signal W is fed to the subtraction unit 26 by a preferably adjustable DESIRED value defining unit 28. The control difference Δ obtained at the subtraction unit 26 is fed as the regulating element by way of a controller 30 or amplifier to at least one of the elements influencing the treatment atmosphere U.

To this extent, in a general way, the description of FIGS. 1 to 4 corresponds to FIG. 5 as well. According to the invention, as schematically illustrated by the position detector 34 in FIG. 5, the momentary position $x_s$ of a workpiece 20 to be treated is now detected and followed. The output signal of the detector arrangement 34 triggers a modulation signal M at a modulation unit 32 which varies with the position $X_s$. The modulation signal M is fed to at least one of the above-mentioned elements in block 22 according to FIG. 5 which also determine the treatment atmosphere U. As a result, the treatment atmosphere U in the treatment area BB is changed in a targeted manner corresponding to the modulation signal M so that, when passing through the treatment area BB, the workpiece 20 is treated corresponding to the selected modulation M with a desired treatment profile along its surface to be treated.

Figure 6:
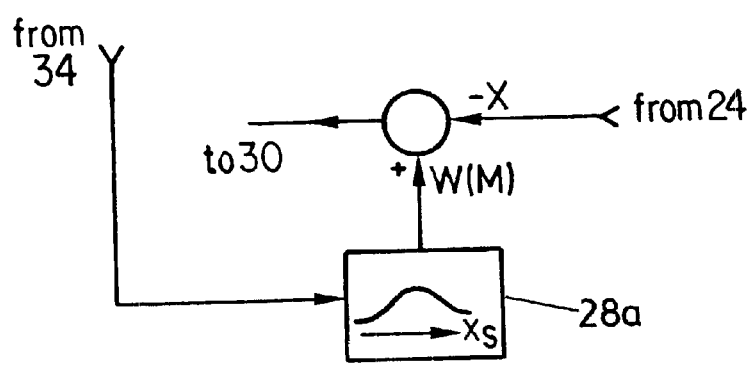
FIG. 6 is a schematic view similar to FIG. 5 of a first embodiment of the modulation according to the invention.

A first form of implementing the modulation according to the invention is obtained in that the modulation from defining unit 28a, as illustrated in FIG. 6, is fed to the subtraction unit also fed with a control quantity −X and the control difference Δ applied to the command variable W of the control circuit and thus the control circuit regulating element is also used for the application of the desired modulation to the treatment environment U.

FIGS. 7 to 10 illustrate described preferred system configurations according to FIGS. 1 to 4, which, however, are further developed according to the invention. On the drum 3, according to FIG. 7, for example and preferably, a rotating-angle receiver 36 is used as the position detector 34. The rotating angle receiver 36, by way of the rotating position signal $\omega_s$, synchronizes the output of the modulation signal $M(\omega_s)$ on the modulation unit 38 with the drum movement and thus the substrate movement. Preferably, an element for the adjustment of the treatment atmosphere U is guided by the modulation signal $M(\omega_s)$, which element is not used as a regulating element of the control circuit.

In the stabilization control of the process implemented in the preferred embodiment, which is necessary in order to deposit on targets conducting in the transition mode poorly conducting or non-conductive coatings by means of reactive gas, on the one hand, the process stability and, on the other hand, the reach-through of the provided modulation $M(\omega_s)$ to the process atmosphere is ensured. That is, preferably the frequency response of the control circuit is adapted by providing filters 44, preferably low-pass filter or band pass filters, most preferably in the path of the measured control quantity.

In the preferred embodiment according to FIGS. 7 to 10, the modulation takes place cyclically corresponding to the substrates 1 which in each case travel past the sputtering source 5. In this case, the repetition frequency of the periodic modulation signal is normally higher than the upper limit frequency of the closed control circuit. Thus, typical reaction times of the illustrated process control are in the range of a few hundred milliseconds to several seconds while, as the result of the rotating speed $\omega$ of the drum and the number of provided substrates 1, the periodic modulation synchronized with the drum movement has a higher repetition frequency.

Figure 7:
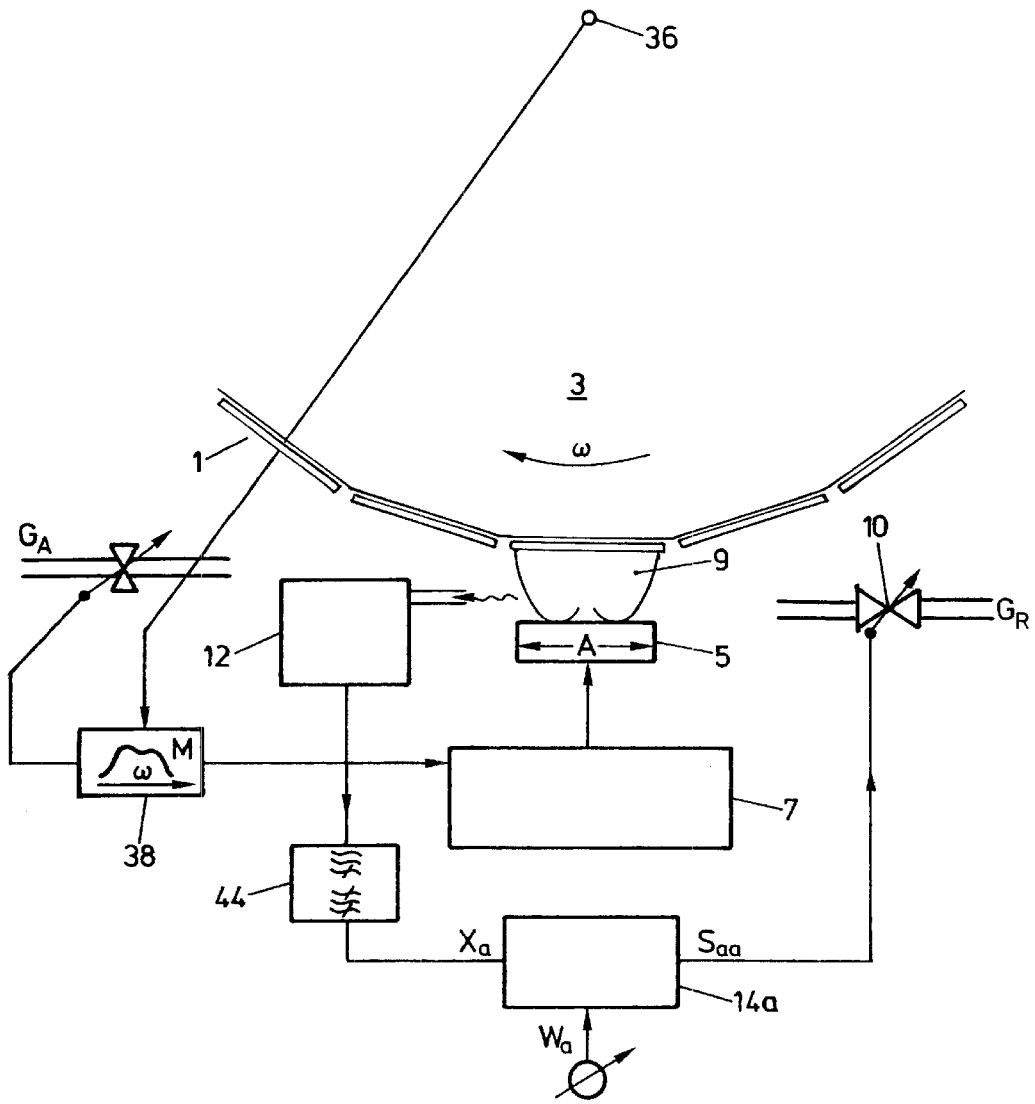
FIGS. 7 to 10 are views similar to FIGS. 1 to 4 of further embodiments of the systems and corresponding manufacturing processes of the invention according to FIGS. 1 to 4.
Figure 8:
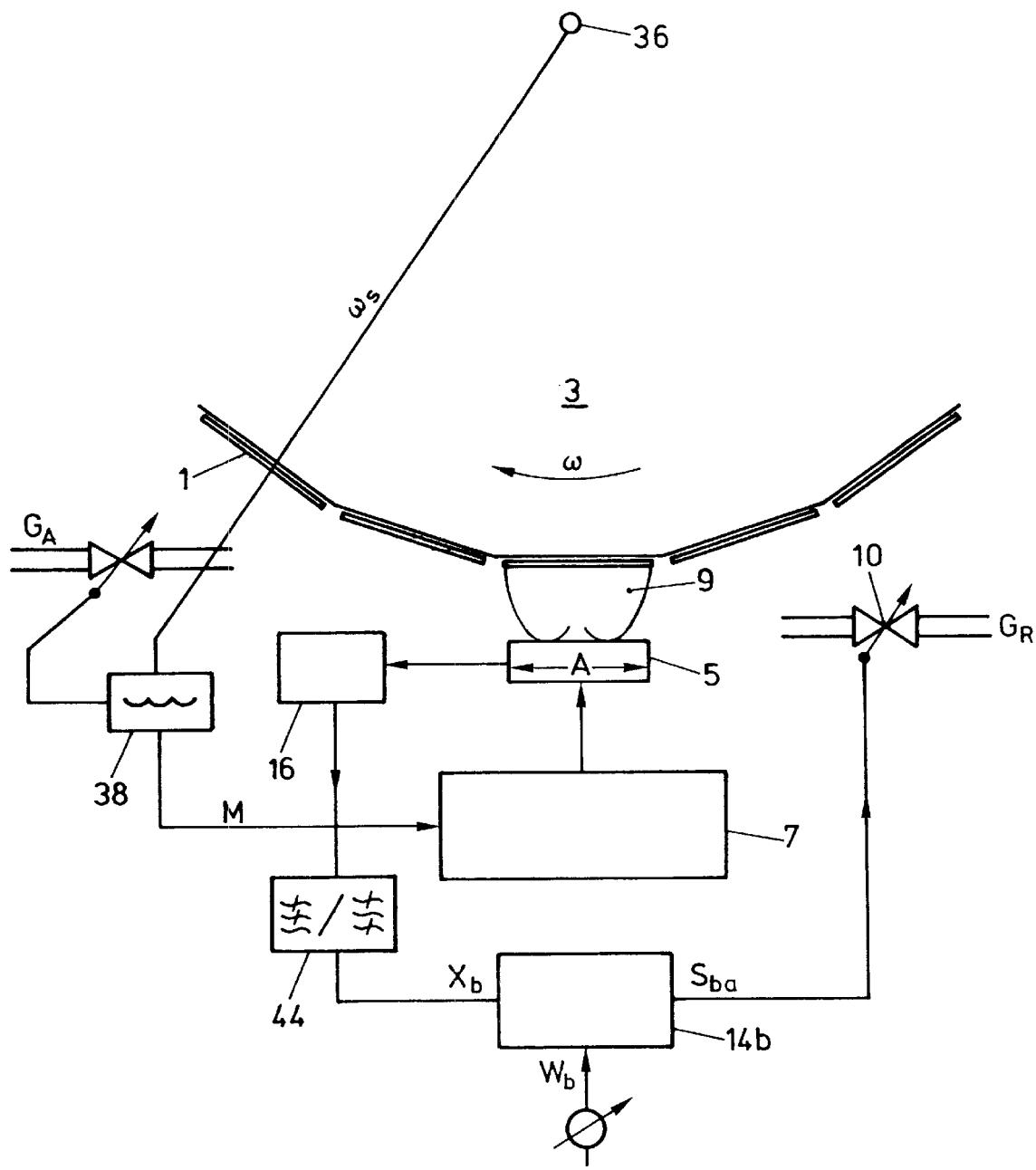
Figure 9:
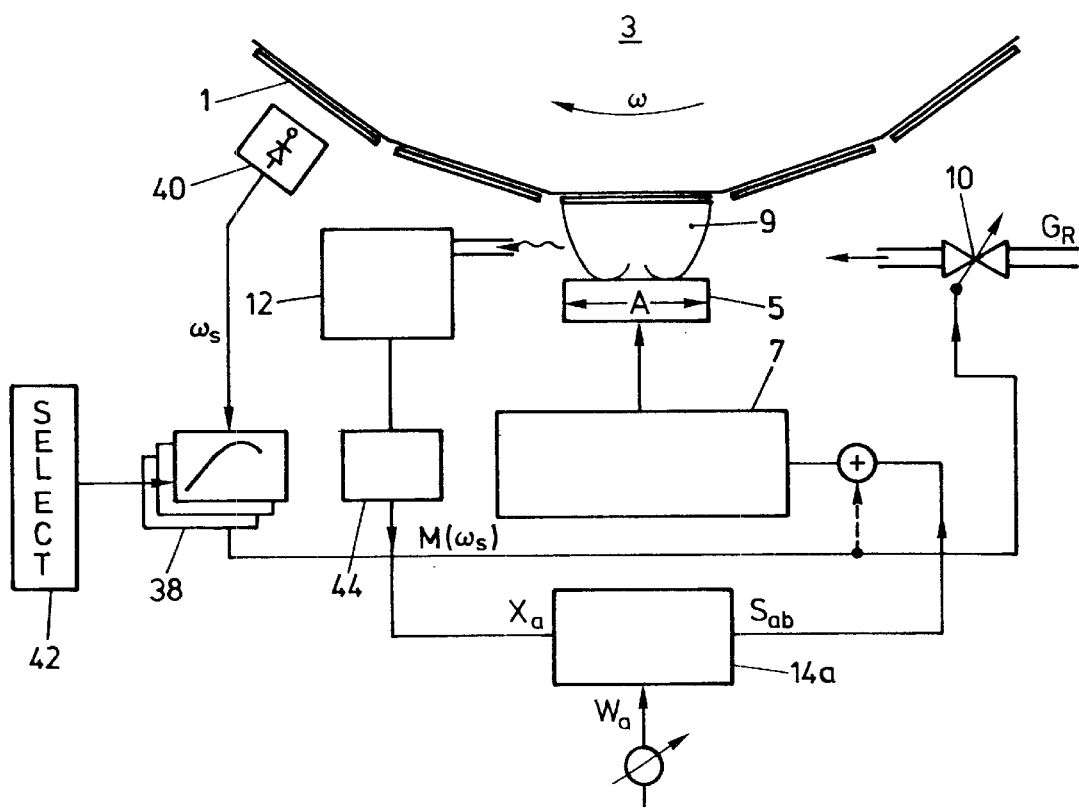
Figure 10:
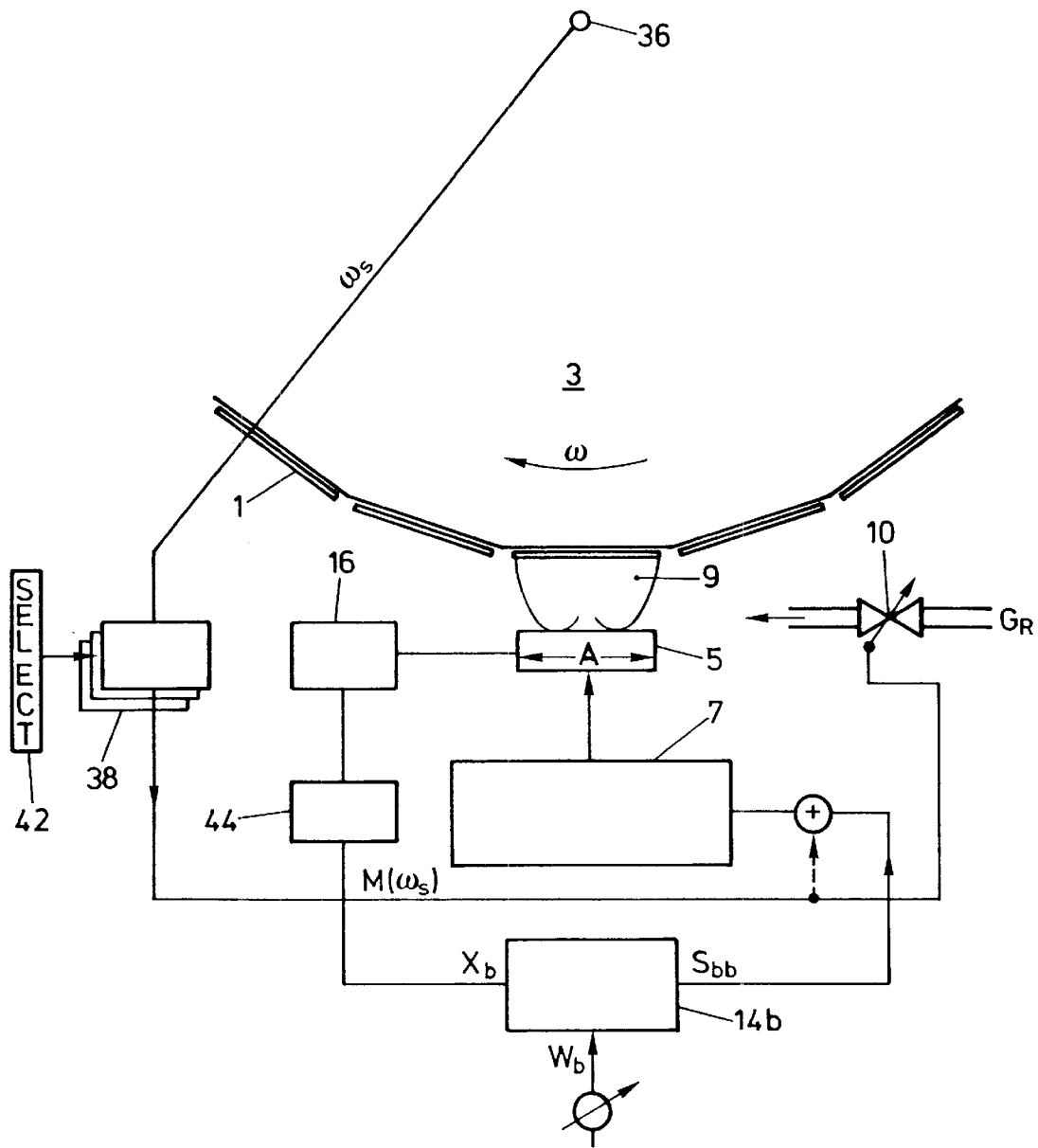

As illustrated in the embodiment of FIG. 9, instead of a rotating angle receiver 36, as illustrated in FIGS. 7, 8 and 10, a position detector 40 can detect the reaching of previously defined substrate positions on the drum periphery.

As further illustrated in FIGS. 9 and 10, one, preferably two or more modulation curve forms are previously stored on the modulation unit 38 and are selectively activated by a selection unit 42 for the respective processing method. The various previously filed modulation curve forms allow different substrate treatments at the same system can also be taken into account.

As also illustrated in FIGS. 7 and 8, the modulation used according to the invention can take place by the modulation of the inert gas or working gas flow GA, alone or optionally in combination with the corresponding modulation of other suitable process quantities, such as the reactive gas flow, the sputtering performance, etc.

In addition, FIGS. 9 and 10 have a dashed line which represents the fact that the modulation used according to the invention can also be implemented by way of the regulating element used for the control, namely the sputtering performance 7. This modulation takes place more slowly than provided by the reaction time of the closed control circuit.

The approach according to the invention is used particularly preferably for reactive coating processes, particularly in the manufacture of optical components. It is surprising that, by using the modulation according to the invention, high layer qualities and layer profiles are achieved which are suitable for optical components. The approach according to the invention is used in particular if the initially defined width B of the substrates or of a substrate batch is larger than the assigned sputtering source dimension A, preferably significantly larger, particularly, five times larger.

Figure 11:
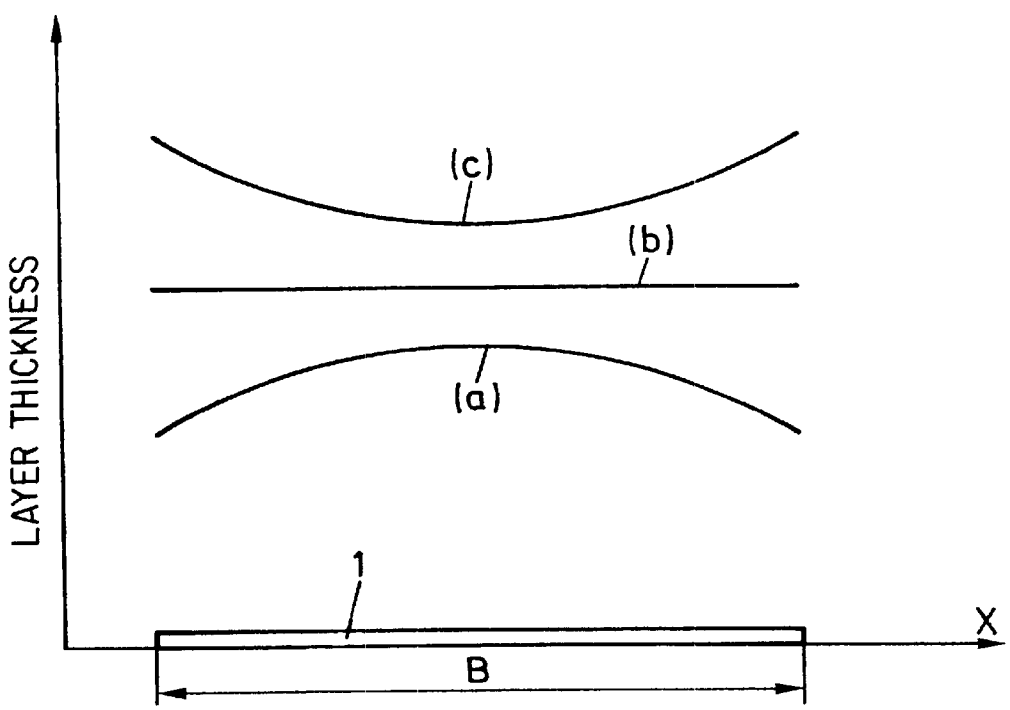
FIG. 11 is a qualitative view with a curve (a) of a layer thickness distribution on substrates if they are manufactured according to processes and systems according to FIGS. 1 to 4; curve (b) in the case of the modulation according to the invention selected for an optimal layer thickness homogeneity; curve (c) in the case of an overcompensation with the modulation according to the invention.
Figure 12:
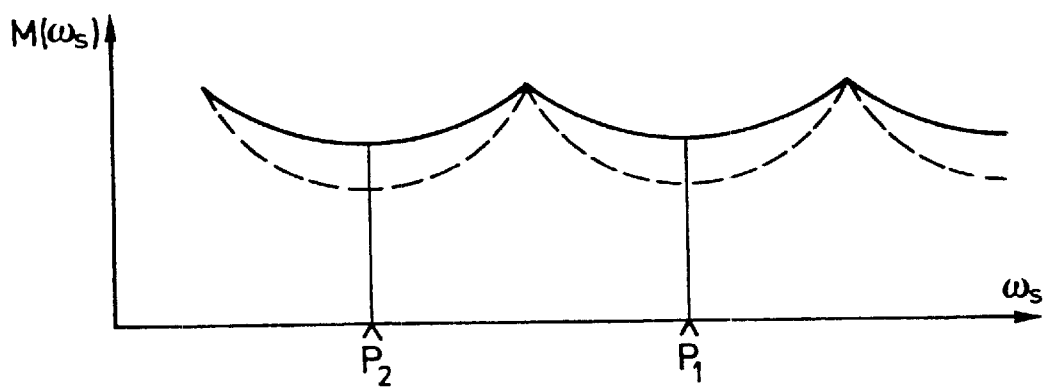
FIG. 12 is a qualitative view of the modulation signal according to the invention applied to the systems shown in FIGS. 7 to 10 in order to achieve layer thickness distributions on the substrates according to FIG. 11(b) or, shown by a broken line, according to (c).

In FIG. 11, the curve (a) qualitatively shows the layer thickness distribution applied to a plane substrate according to FIGS. 1 to 4 by sputtering from the source 5, specifically independently of whether the depositing of target material layers in the metallic mode is involved or the depositing of layer materials reacted in the intramode or transition mode to electrically non-conductive layers. As the result of a modulation ($M\omega_s$) according to FIGS. 7 to 10 and as illustrated in FIG. 12, the curve (a) of FIG. 11 can be precisely compensated. A layer thickness distribution is obtained on the substrates, as illustrated by curve (b) in FIG. 11. With an overcompensation by means of the used modulation, as illustrated, for example, in FIG. 12 by a broken line, a layer thickness distribution is obtained which is indicated in FIG. 11 at (c) At points $P_1$, $P_2$ . . . of FIG. 12, the modulated treatment atmosphere passes through an intensity minimum. At that minimum, the respective substrates 1 are situated in a centered manner with respect to the sputtering source. In the transition from the convex moving path to the concave moving path with respect to the sputtering source, the preferably used minimum/maximum assignments of the modulations are, of course, inverted.

It was therefore recognized in discovering the present invention that, in systems of the type illustrated in FIGS. 1 to 4, also during the sputter coating in the metal mode (i.e., without reactive gas), the chord effect can be compensated by minimizing the sputtering performance if the substrates are situated in a centered manner above the sputtering source.

As a result, an optimal uniformity of the layer thickness over the substrate width B is obtained, which is significant, for example, with substrate widths of at least 12 cm. In this case, the adaptation of the modulation curve forms permits the achievement of targeted desired treatment distributions, in the preferred case, coating distributions. Mechanical imprecisions of the system configuration, for example, of substrate carriers, can be compensated by correspondingly designed modulation forms.

If desired, it is also within the contemplation of the present invention, in the workpieces which are simultaneously provided on the drum 3 and which, however, are to be coated with different layer thickness distributions, to add respective different modulation curve forms. For example, meters (not shown) will then detect which of the substrates are momentarily moving into the treatment area BB of the sputtering source, and the correspondingly pertaining modulation curve form is activated by the selection unit 42.

According to the present invention, the layer thickness distribution is adjusted in a targeted manner on the substrates moving past. This feature makes possible reduction of the precision requirements on the treatment system, particularly with respect to its workpiece carrier and precise positioning of the sputtering source. Undesirable layer thickness distributions which are the primary result are compensated by the modulation according to the present invention.

Furthermore, in a targeted manner, certain desired layer thickness distributions and profiles, for example, for gradient filters, can also be implemented. An important aspect of the present invention is also the coating of substrates which are not planar, such as lens bodies, with a uniform layer thickness distribution.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A vacuum treatment system having a vacuum treatment chamber, comprising elements configured to establish a treatment atmosphere in a treatment area, a sensor arrangement configured to detect the treatment atmosphere momentarily existing in the treatment area, as an ACTUAL value sensor of the sensor arrangement at least one of the elements being a regulating element of a control circuit for the treatment atmosphere in the treatment area, and a workpiece carrier which is drivably movable in the chamber through the treatment area, wherein at least one of the elements modulates the treatment atmosphere in the treatment area according to a defined profile as a function of the workpiece carrier position and the modulation takes place in a frequency range which is above an upper limit frequency of the control circuit.

2. The vacuum treatment system according to claim 1, wherein an adjustable DESIRED value defining unit is operatively associated with the control circuit, and modulation is effected by modulation of a DESIRED value.

3. The vacuum treatment system according to claim 1, wherein at least one sputtering source with an electrically conductive target is provided in the vacuum chamber which is connected to a reactive gas tank arrangement with a reactive gas which is reactable with material released by the sputtering source to an electrically less conductive coating material, and the modulation is carried out at an electric source for the sputtering source.

4. The vacuum treatment system according to claim 1, wherein a moved workpiece carrier comprises a carrier drum drivably rotating in the chamber or a carrier carousel with workpiece receiving devices distributed thereon, and modulation is synchronized with the movement of the drum or carousel and is carried out with a repetition frequency which corresponds to a workpiece carrier passing frequency at a chamber-fixed site in an area of the drum or of the carousel.

5. The vacuum treatment system according to claim 1, wherein a modulation form memory unit is provided with at least one, previously stored modulation course and a selection unit for selectively applying said at least one modulation course to the at least one of the elements.

6. A vacuum treatment system, having a vacuum treatment chamber, comprising elements configured to establish a treatment atmosphere in a treatment area, a sensor arrangement configured to detect the treatment atmosphere momentarily existing in the treatment area, as an ACTUAL value sensor of the sensor arrangement at least one of the elements being a regulating element of a control circuit for the treatment atmosphere in the treatment area, and a workpiece carrier which is drivably movable in the chamber through the treatment area, wherein at least one of the elements modulates the treatment atmosphere in the treatment area according to a defined profile as a function of the workpiece carrier position, wherein at least one sputtering source with an electrically conductive target is provided in the vacuum chamber which is connected to a reactive gas tank arrangement with a reactive gas which is reactable with material released by the sputtering source to an electrically less conductive coating material, and the modulation is carried out at an electric source for the sputtering source, and the electrical source is at least one of a DC supply generator for the sputtering source and of a chopper unit connected between a DC supply generator and the sputtering source.

7. The vacuum treatment system according to claim 6, wherein an adjustable DESIRED value defining unit is operatively associated with the control circuit, and modulation is effected by modulation of a DESIRED value.

8. The vacuum treatment system according to claim 6, wherein the modulation takes place in a frequency range which is above an upper limit frequency of the control circuit.

9. The vacuum treatment system according to claim 6, wherein a moved workpiece carrier comprises a carrier drum drivably rotating in the chamber or a carrier carousel with workpiece receiving devices distributed thereon, and modulation is synchronized with the movement of the drum or carousel and is carried out with a repetition frequency which corresponds to a workpiece carrier passing frequency at a chamber-fixed site in an area of the drum or of the carousel.

10. The vacuum treatment system according to claim 6, wherein a modulation form memory unit is provided with at least one, previously stored modulation course and a selection unit for the selective adding of a desired modulation course to the at least one of the elements.

11. A process for manufacturing workpieces, comprising the steps of guiding the workpieces to a vacuum treatment, moving the workpieces through a treatment atmosphere in a treatment area guided by a control, and modulating a treatment atmosphere in a treatment area as a function of workpiece position with a defined profile, wherein the modulation is carried out by modulation of DESIRED value on the control.

12. A method for manufacturing workpieces, comprising the steps of guiding the workpieces to a vacuum treatment, moving the workpieces through a treatment atmosphere in a treatment area controlled by a control loop, and modulating a treatment atmosphere in a treatment area as a function of workpiece position with a defined profile, wherein the modulation occurs with a frequency spectrum which is above an upper limit frequency of said control loop.

13. A method according to claim 12, wherein the step of moving comprises moving the workpieces in a vacuum chamber past a sputtering source with an electrically conductive target, and admitting reactive gas to the vacuum chamber, whereby the material released by the sputtering source reacts to an electrically less conductive coating material for the workpieces, and the modulation is carried out on an electric sputtering source supply.

14. The method according to claim 12, wherein the workpieces are periodically moved past a treatment source in the vacuum chamber, and the modulation is synchronized with periodic workpiece passage.

15. The process according to claim 14, wherein the workpieces are moved past the source on a circular path which is convex or concave with respect to the treatment source.

16. The method according to claim 12, wherein various modulation curve courses are previously stored and selectively activated for the modulation of the treatment atmosphere.

17. The process according to claim 12, wherein the modulation is carried out by modulation of DESIRED value on the control.

18. The process according to claim 12, comprising the steps of guiding the workpieces to a vacuum treatment, moving the workpieces through a treatment atmosphere in a treatment area guided by a control, and modulating a treatment atmosphere in a treatment area as a function of workpiece position with a defined profile, wherein the step of moving comprises moving the workpieces in a vacuum chamber past a sputtering source with an electrically conductive target, and admitting reactive gas to the vacuum chamber, whereby the material released by the sputtering source enters an electrically less conductive connection as coating material for the workpieces, and the modulation is carried out on an electric sputtering source supply, and the sputtering source is supplied by a DC generator and between the generator and the sputtering source, a current path switched in a controllable manner to high and low resistance bridges sputtering source supply connections.

19. The process according to claim 12, wherein the workpieces are periodically moved past a treatment source on a circular path which is convex or concave with respect to the treatment source in the vacuum chamber, and the modulation is synchronized with periodic workpiece passage.

20. The method of claim 19, wherein said circular path is convex and said treatment source is a sputter source, further comprising controlling power of said sputter source to reach a minimum as said workpiece reaches a position centrally aligned with said sputter source.

21. The method of claim 19, wherein said circular path is concave and said treatment source is a sputter source, further comprising controlling power of said sputter source to reach a maximum as said workpiece reaches a position centrally aligned with said sputter source.

22. The method of claim 12, comprising a step of manufacturing workpieces configured as flat substrates.

23. The method of claim 22, further comprising moving said flat substrates past a sputtering source having an extent which is smaller than an extent of said flat substrates.

24. The method of claim 22, comprising manufacturing said flat substrates by reactive sputter coating.

25. The method of claim 22, further comprising depositing on said workpieces a coating with a predetermined coating thickness distribution profile.

26. The method of claim 25, further comprising depositing said coating by reactive process coating.

27. The method of claim 22, wherein the manufactured workpieces are optical devices.

28. The method of claim 12, further comprising modulating said treatment atmosphere by modulating a flow of reactive gas inlet to said treatment atmosphere.

29. The method of claim 28, wherein the workpieces are periodically moved past a sputter source on a circular path which is convex and said flow is maximized when said workpiece reaches a position centrally aligned with said sputter source.

30. The method of claim 28, wherein the workpieces are periodically moved past a sputtering source on a circular path which is concave and said flow is minimized when said workpiece reaches a position centrally aligned with said sputter source.

31. The method of claim 12, further comprising modulating said treatment atmosphere by modulating a flow of a working gas inlet to said treatment atmosphere.

32. The method of claim 31, wherein the workpieces are periodically moved past a sputter source on a circular path which is convex and said flow is minimized when said workpiece reaches a position centrally aligned with said sputter source.

33. The method of claim 31, wherein the workpieces are periodically moved past a sputter source on a circular path which is concave and said flow is maximized when said workpiece reaches a position centrally aligned with said sputter source.

34. A workpiece manufacturing method, comprising the steps of guiding one or more workpieces to a vacuum treatment, moving the workpieces through a treatment atmosphere in a treatment area controlled by a control loop, and modulating a treatment atmosphere in a treatment area as a function of workpiece position with a defined profile, wherein the step of moving comprises moving the workpieces in a vacuum chamber past a sputtering source with an electrically conductive target, and admitting reactive gas to the vacuum chamber, whereby the material released by the sputtering source enters an electrically less conductive connection as coating material for the workpieces, with the modulation being carried out on an electric sputtering source supply and the sputtering source being supplied by a DC generator, and between the generator and the sputtering source, a current path switched in a controllable manner to high and low resistance and bridging said sputtering source supply connections.

35. The method of claim 34, comprising a step of manufacturing workpieces configured as flat substrates.

36. The method of claim 35, further comprising moving said flat substrates past a sputtering source having an extent which is smaller than an extent of said flat substrates.

37. The method of claim 34, comprising manufacturing said workpieces configured as flat substrates by reactive sputter coating.

38. The method of claim 34, further comprising depositing on said workpieces a coating with a predetermined coating thickness distribution profile.

39. The method of claim 38, further comprising depositing said coating by reactive process coating.

40. The method of claim 34, wherein the manufactured workpieces are optical devices.

41. The method of claim 34, further comprising modulating said treatment atmosphere by modulating a flow of reactive gas inlet to said treatment atmosphere.

42. The method of claim 41, wherein the workpieces are periodically moved past a sputter source on a circular path which is convex and said flow is maximized when said workpiece reaches a position centrally aligned with said sputter source.

43. The method of claim 41, wherein the workpieces are periodically moved past a sputtering source on a circular path which is concave and said flow is minimized when said workpiece reaches a position centrally aligned with said sputter source.

44. The method of claim 34, further comprising modulating said treatment atmosphere by modulating a flow of a working gas inlet to said treatment atmosphere.

45. The method of claim 44, wherein the workpieces are periodically moved past a sputter source on a circular path which is convex and said flow is minimized when said workpiece reaches a position centrally aligned with said sputter source.

46. The method of claim 44, wherein the workpieces are periodically moved past a sputter source on a circular path which is concave and said flow is maximized when said workpiece reaches a position centrally aligned with said sputter source.

* * * * *